(12) United States Patent
Kim

(10) Patent No.: US 6,909,293 B2
(45) Date of Patent: Jun. 21, 2005

(54) SPACE-SAVING TEST STRUCTURES HAVING IMPROVED CAPABILITIES

(75) Inventor: Hyeon-Seag Kim, San Jose, CA (US)

(73) Assignee: Advanced Micro Devices, Inc., Sunnyvale, CA (US)

( * ) Notice: Subject to any disclaimer, the term of this patent is extended or adjusted under 35 U.S.C. 154(b) by 4 days.

(21) Appl. No.: 10/423,197

(22) Filed: Apr. 25, 2003

(65) Prior Publication Data

US 2004/0212376 A1 Oct. 28, 2004

(51) Int. Cl.$^7$ .................. G01R 31/08; G01R 31/02; H01L 23/58
(52) U.S. Cl. .................. 324/719; 324/525; 324/763; 257/48
(58) Field of Search .................. 324/719, 717, 324/763–765, 500–537; 257/48; 438/14, 17–18

(56) References Cited

U.S. PATENT DOCUMENTS

| | | | |
|---|---|---|---|
| 5,264,377 A | * 11/1993 | Chesire et al. | 438/11 |
| 6,037,795 A | 3/2000 | Filippi et al. | |
| 6,417,572 B1 | 7/2002 | Chidambarrao et al. | |
| 6,459,153 B1 | * 10/2002 | Sengupta | 257/758 |
| 6,680,484 B1 | * 1/2004 | Young | 257/48 |
| 6,747,445 B2 | * 6/2004 | Fetterman et al. | 324/71.1 |
| 2004/0124865 A1 | * 7/2004 | Chuang et al. | 324/760 |

OTHER PUBLICATIONS

"Integrated Test Structure" IBM Technical Disclosure Bulletin, Oct. 1986, vol. 29, Issue 5, pp. 2124–2125.*
Arnaud et al., "Evidence of grain–boundary versus interface diffusion in electromigration experiments in copper damascene interconnects," Journal of Applied Physics, New York, US, vol. 93, No. 1, Jan. 1, 2003, pp. 192–204, XP012057647, ISSN: 0021–8979.

Zamani et al., "Chip–Level Electromigration Measurement Technique for MultiSegmented Interconnect Test Structures," IEEE, Jun. 12, 1989, pp. 198207, XP010092442.

Zamani et al., "Temperature Control in Waferlevel Testing of LargeMulti–segment Electromigration Test Structures," IEEE Proceedings on Microelectronic Test Structures, Feb. 22, 1988, pp. 138–142, XP010277975.

Anonymous, "Monitor system for electromigration extrusion detection," Kenneth Mason Publications, Hampshire, GB, vol. 241, No. 41, May 1984, XP007109334, ISSN: 0374–4353.

* cited by examiner

Primary Examiner—Edward Lefkowitz
Assistant Examiner—Jeff Natalini
(74) Attorney, Agent, or Firm—Farjami & Farjami LLP

(57) ABSTRACT

A space-saving test structure includes a core metal line, at least one extrusion detection line and an extrusion monitoring segment. The core metal line has a "non-linear configuration" and is capable of conducting current for an electromigration test, an isothermal test, and extrusion monitoring. The at least one extrusion detection line is situated adjacent to the core metal line. The extrusion monitoring segment is electrically connected to the at least one extrusion detection line. The extrusion monitoring segment is adapted to determine whether an extrusion occurs in the core metal line by measuring a resistance between the core metal line and the at least one extrusion detection line.

20 Claims, 4 Drawing Sheets

SPACE-SAVING TEST STRUCTURES HAVING IMPROVED CAPABILITIES

TECHNICAL FIELD

The present invention relates generally to the field of semiconductor devices. More particularly, the present invention relates to test structures in semiconductor devices.

BACKGROUND ART

The lifetime, i.e. time between first use and failure, of semiconductor dies can be approximated by test structures. Electromigration ("EM"), i.e. the transport of atoms in metal due to the "electron wind" effect, can ultimately cause failure in semiconductor dies due to the formation of "voids", i.e. open circuits, or "hillocks", i.e. extrusions causing short circuits, in metal lines.

EM test structures simulate the failure of devices due to the effects of electromigration. The National Institute of Standards and Technology ("NIST") has proposed a standard of 800 microns for EM test structure length. Conventional EM test structures comprise metal lines in a linear configuration having an EM test structure length of 800 microns. These conventional EM test structures are typically situated on scribe lines on a semiconductor wafer.

Disadvantageously, situating conventional EM test structures on scribe lines requires significant consumption of wafer area due to EM test structures having linear configurations and EM test structure lengths of 800 microns, which result in less wafer area for die fabrication, and which increase manufacturing costs. Moreover, conventional EM test structures lack the capability of rapidly detecting extrusions. Conventional EM test structures further lack the capability of performing effective isothermal testing, i.e. detecting voids formed due to the Joule heating effect. Accordingly, there exists a strong need in the art to overcome deficiencies of known test structures such as those described above.

SUMMARY

The present invention is directed to space-saving test structures having improved capabilities. The invention addresses and resolves the need in the art for a test structure which has reduced area consumption, electromigration test capabilities, isothermal test capabilities and extrusion monitoring capabilities.

According to one exemplary embodiment, the test structure includes a core metal line, at least one extrusion detection line, and an extrusion monitoring segment. The core metal line has a "non-linear configuration" and is capable of conducting current for an electromigration test, an isothermal test, and extrusion monitoring. The at least one extrusion detection line is situated adjacent to the core metal line. The extrusion monitoring segment is electrically connected to the at least one extrusion detection line. The extrusion monitoring segment is adapted to determine whether an extrusion occurs in the core metal line by measuring a resistance between the core metal line and the at least one extrusion detection line. In one embodiment, the core metal line has a serpentine configuration, while in other embodiments, the core metal line has a square spiral, a step, or a circular spiral configuration. Other features and advantages of the present invention will become more readily apparent to those of ordinary skill in the art after reviewing the following detailed description and accompanying drawings.

DETAILED DESCRIPTION OF THE INVENTION

The present invention is directed to space-saving test structures having improved capabilities. The following description contains specific information pertaining to the implementation of the present invention. One skilled in the art will recognize that the present invention may be implemented in a manner different from that specifically discussed in the present application. Moreover, some of the specific details of the invention are not discussed in order not to obscure the invention.

The drawings in the present application and their accompanying detailed description are directed to merely exemplary embodiments of the invention. To maintain brevity, other embodiments of the present invention are not specifically described in the present application and are not specifically illustrated by the present drawings.

Figure 1:
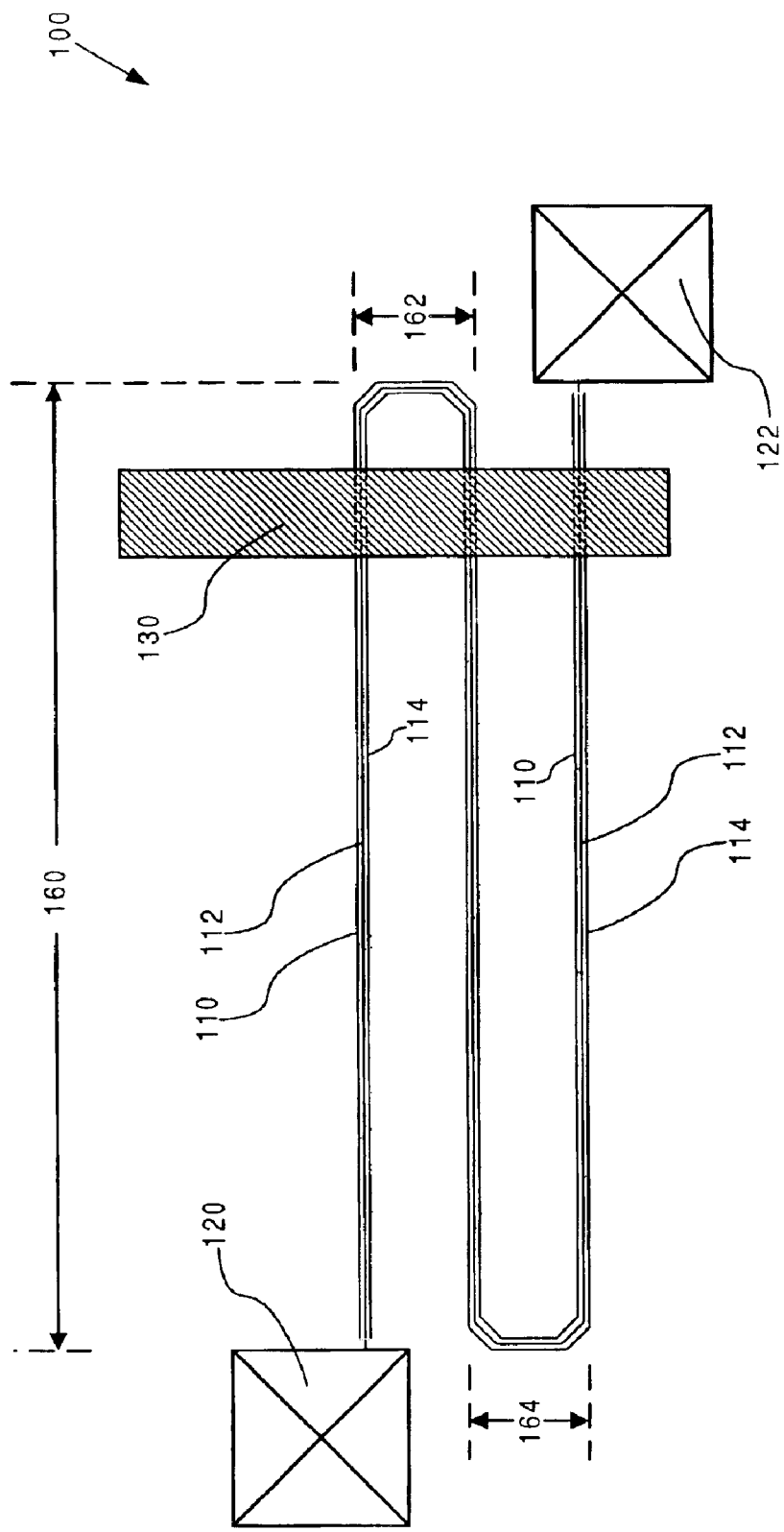
FIG. 1 shows a top view of a test structure according to one embodiment of the invention.

FIG. 1 shows a top view of test structure 100 formed in accordance with one embodiment of the invention. In one embodiment, test structure 100 is situated on a scribe line of a semiconductor wafer or die and includes core metal line 112, extrusion detection lines 110 and 114, contact metal pads 120 and 122 and extrusion monitoring segment 130. Core metal line 112 and extrusion detection lines 110 and 114 comprise a metal conductor such as copper or another metal of choice. In one embodiment, core metal line 112 and extrusion detection lines 110 and 114 are substantially parallel to each other and are situated in the same metal level, for example, metal level 1.

According to the present embodiment, core metal line 112 and extrusion detection lines 110 and 114 have a "serpentine" configuration, which advantageously decreases the scribe line length required to implement test structure 100, and which allows an increase in the number of semiconductor dies on a wafer. The serpentine configuration is also referred to as a "non-linear configuration" in the present application which, in the present embodiment, includes three long segments and two short segments. The long segments each have length 160 and the short segments have lengths 162 and 164. In one embodiment, length 160 is equal to approximately 250 microns and lengths 162 and 164 are each equal to approximately 25 microns, and thus, the total length of core metal line 112 is equal to approximately 800 microns. Those of ordinary skill in the art shall recognize that the length of each segment and the number of segments of the serpentine configuration can vary without departing from the scope of the present invention. As shown in FIG. 1, in the present embodiment, core metal line 112 and extrusion detection lines 110 and 114 have smooth turns, as opposed to right angle turns, to form the serpentine configuration. In the present embodiment, right angle turns are avoided in order to avoid early electromigration or extrusion failures at sharp corners that would occur if right angle turns were utilized. As such, in the present embodiment, the failure mechanisms that will be tested and detected will not be tainted due to the existence of sharp corners.

Contact metal pads 120 and 122 are typically situated in the same metal level such as metal level 1, metal level 2, or metal level 3. In one embodiment, contact metal pads 120 and 122 are in a different metal level than core metal line 112 and extrusion detection lines 110 and 114. Contact metal pad 120 is electrically connected to a first end of core metal line 112. Similarly, contact metal pad 122 is electrically connected to a second end of core metal line 112. Extrusion detection lines 110 and 114 are not electrically connected to metal pads 120 and 122. In one embodiment, contact metal pads 120 and 122 are adapted to electrically connect to test probes. Contact metal pads 120 and 122 can be used to conduct current through core metal line 112 as described further below in relation to electromigration and isothermal testing.

Extrusion monitoring segment 130 is situated in a metal level above core metal line 112 and extrusion detection lines 110 and 114. Those of ordinary skill in the art shall recognize that extrusion monitoring segment 130 can be situated in different metal levels such as a metal level below core metal line 112 and extrusion detection lines 110 and 114 without departing from the scope of the invention. Through appropriately placed contacts to extrusion detection lines 110 and 114, extrusion monitoring segment 130 can aid in measuring the resistance between core metal line 112 and extrusion detection line 110 or extrusion detection line 114 as described further below in relation to extrusion monitoring during electromigration and isothermal testing.

According to the invention, test structure 100 of FIG. 1 can be used to perform isothermal testing, electromigration testing and extrusion monitoring. Isothermal testing indicates the presence of defects such as voids in metal lines. Isothermal testing forces an extremely high current through test structures for a relatively short duration, for example, 100 seconds. The presence of a void in a test structure increases the resistance near the area of the void. Due to the Joule effect, an increase in resistance, which indicates a void, is accompanied by an increase in temperature. Thus, during isothermal testing, a temperature increase indicates a void near the area associated with the temperature increase. Referring to FIG. 1, test structure 100 can be used to perform isothermal testing. Test probes can be electrically connected to contact metal pads 120 and 122 to conduct extremely high current through core metal line 112 for a relatively short duration. During isothermal testing, core metal line 112 can be monitored for temperature increases, which indicate the presence of voids.

Electromigration testing approximates the lifetime of metal conductors under normal operating conditions. Electromigration testing includes conducting a higher-than-normal current through test structures for an extended duration, for example, 14 days. The higher-than-normal current used in EM testing is significantly less than the extremely high current used in isothermal testing. Failure during EM testing can be correlated to determine the lifetime of metal conductors under normal operating conditions. Referring to FIG. 1, test structure 100 can be used to perform EM testing. Test probes can be electrically connected to contact metal pads 120 and 122 to conduct higher-than-normal current through core metal line 112 for an extended duration. The amount of time to failure can be determined and correlated to determine the lifetime of metal conductors under normal operating conditions.

Extrusion monitoring determines whether an extrusion occurs during testing such as isothermal or EM testing. Extrusion monitoring measures the resistance between a metal conductor line and a parallel metal line. A decrease in resistance indicates that an extrusion in the metal conductor line is contacting the parallel metal line, which causes a short circuit. Referring to FIG. 1, test structure 100 can be used to perform extrusion monitoring during isothermal or EM testing. Extrusion monitoring structure 130 monitors the resistance between core metal line 112 and extrusion detection line 110 and the resistance between core metal line 112 and extrusion detection line 114. Under normal conditions, i.e. without extrusions, the resistance approaches infinity, i.e. open circuit conditions. However, under failure conditions, i.e. with extrusions, the resistance approaches zero, i.e. short circuit conditions. For example, extrusion monitoring structure 130 indicates an extrusion when the resistance is less than a predetermined value such as 5 ohms.

Figure 2:
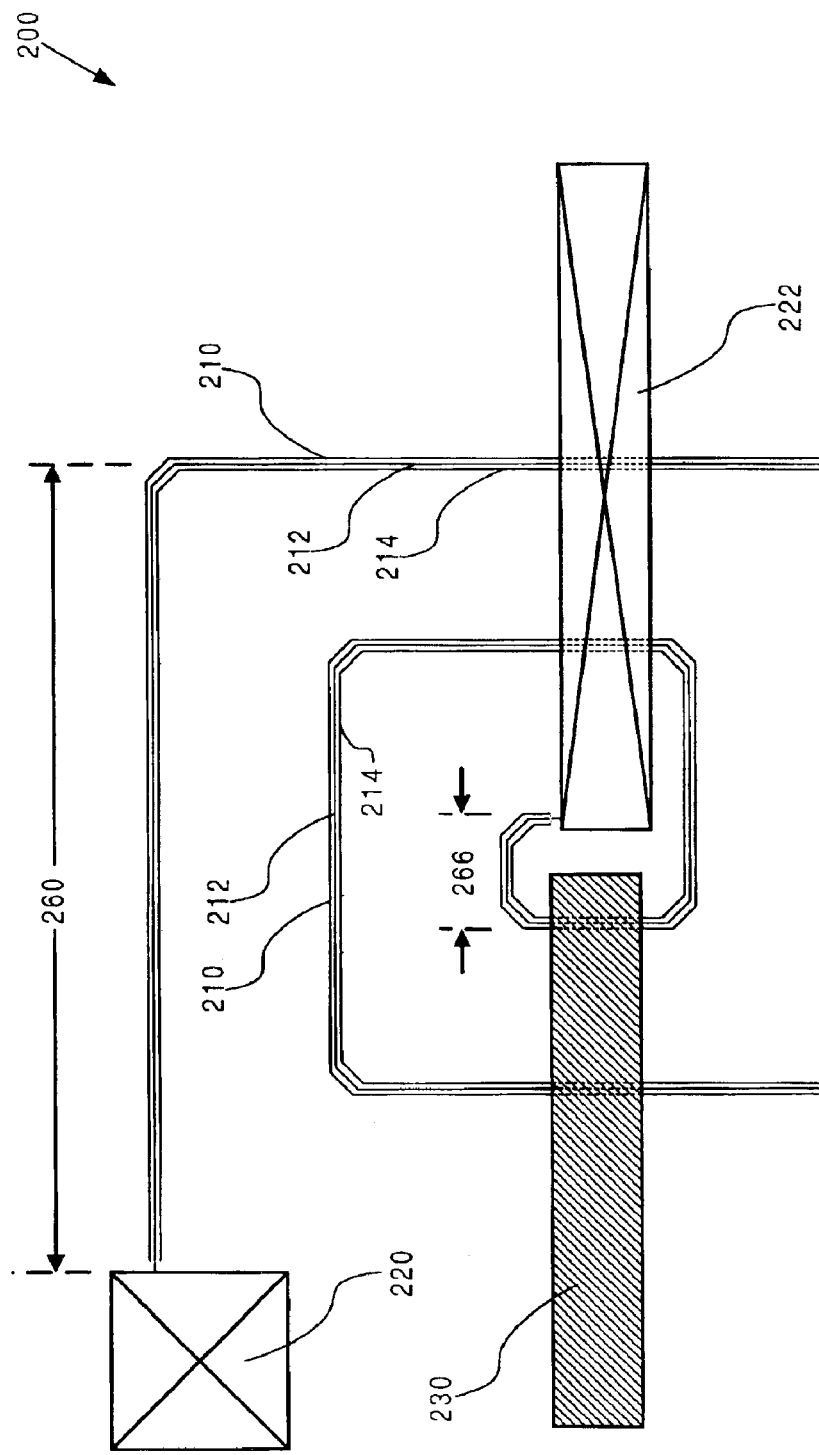
FIG. 2 shows a top view of a test structure according to one embodiment of the invention.

FIG. 2 shows a top view of test structure 200 formed in accordance with one embodiment of the invention. Test structure 200 is similar to test structure 100 of FIG. 1 and, thus, similar elements are not described in detail. In one embodiment, test structure 200 is situated on a scribe line of a semiconductor wafer or die and includes core metal line 212, extrusion detection lines 210 and 214, contact metal pads 220 and 222 and extrusion monitoring segment 230, which are analogous to core metal line 112, extrusion detection lines 110 and 114, contact metal pads 120 and 122 and extrusion monitoring segment 130 of test structure 100 of FIG. 1, respectively. In one embodiment, core metal line 212 and extrusion detection lines 210 and 214 comprise a metal conductor such as copper and are substantially parallel to each other.

According to one embodiment, core metal line 212 and extrusion detection lines 210 and 214 have a "square spiral" configuration, which advantageously decreases the scribe line length required to implement test structure 200, and which allows an increase in the number of semiconductor dies on a wafer. The square spiral configuration is also referred to as a "non-linear configuration" in the present application and includes multiple metal segments where the length of each metal segment increases as the metal segment is situated further from a focal end of the square spiral. In one embodiment, a longest segment has length 260, which can range between approximately 150 microns and approximately 200 microns. In one embodiment, a shortest segment has a length equal to approximately 1 micron. In one embodiment, the total length, i.e. sum of all segments, of core metal line 212 is equal to approximately 800 microns. Those of ordinary skill in the art shall recognize that the length of each segment and the number of segments of the square spiral configuration can vary without departing from the scope of the present invention. As shown in FIG. 2, in the present embodiment, core metal line 212 and extrusion detection lines 210 and 214 have smooth turns, as opposed to right angle turns, to form the square spiral configuration. In the present embodiment, right angle turns are avoided in order to avoid early electromigration or extrusion failures at sharp corners that would occur if right angle turns were utilized. As such, in the present embodiment, the failure mechanisms that will be tested and detected will not be tainted due to the existence of sharp corners.

As shown in FIG. 2, contact metal pad 220 is electrically connected to a first end of core metal line 212. Similarly, contact metal pad 222 is electrically connected to a second or focal end of core metal line 212. Extrusion detection lines 210 and 214 are not electrically connected to metal pads 220 and 222. In one embodiment, contact metal pads 220 and 222 are in a higher metal level than core metal line 212 and extrusion detection lines 210 and 214, however, contact metal pads 220 and 222 can be in different metal levels, for example, a lower metal level than core metal line 212 and extrusion detection lines 210 and 214. Contact metal pads 220 and 222 can be used to conduct current through core metal line 212. Through appropriately placed contacts to extrusion detection lines 210 and 214, extrusion monitoring segment 230 can aid in measuring the resistance between core metal line 212 and extrusion detection line 210 or extrusion detection line 214.

According to the invention, test structure 200 of FIG. 2 can be used to perform isothermal testing, electromigration testing and extrusion monitoring in a similar manner as described above in relation to test structure 100 of FIG. 1. Moreover, test structure 200 of FIG. 2 can be used to determine critical or Blech lengths, i.e. threshold length at which metal conductor lines undergo EM damage. Blech length can be determined by performing an EM test and determining which metal segments contain defects or voids. The Blech length is approximately equal to the length of the shortest metal segment containing the defect or void. For example, the Blech length of test structure 200 is approximately equal to length 266 when the shortest metal segment of core metal line 212 that contains a void has length 266.

Figure 3:
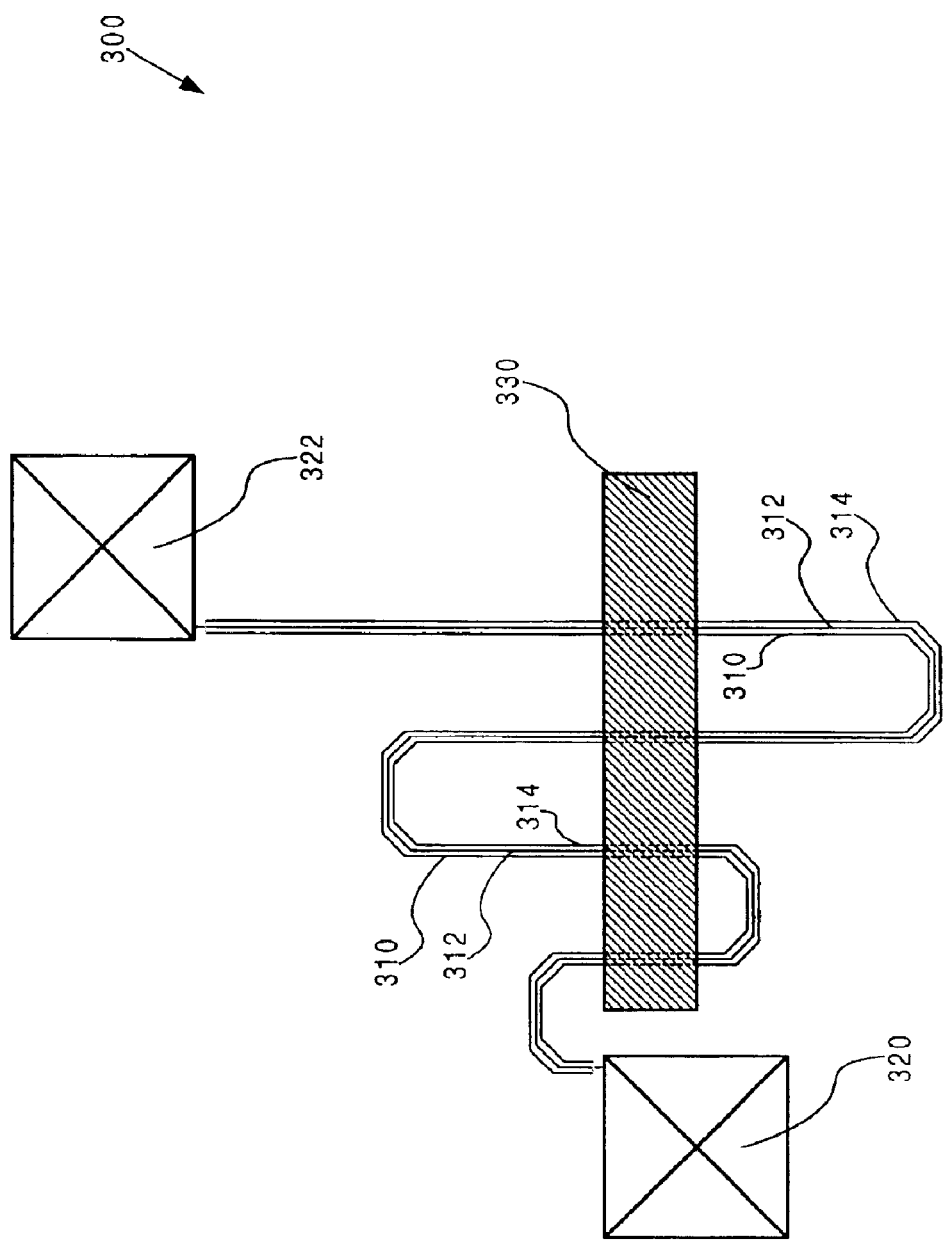
FIG. 3 shows a top view of a test structure according to one embodiment of the invention.

FIG. 3 shows a top view of test structure 300 formed in accordance with one embodiment of the invention. Test structure 300 is similar to test structure 200 of FIG. 2 and, thus, similar elements are not described in detail. In one embodiment, test structure 300 is situated on a scribe line of a semiconductor wafer or die and includes core metal line 312, extrusion detection lines 310 and 314, contact metal pads 320 and 322 and extrusion monitoring segment 330, which are analogous to core metal line 212, extrusion detection lines 210 and 214, contact metal pads 220 and 222 and extrusion monitoring segment 230 of test structure 200 of FIG. 2, respectively. In one embodiment, core metal line 312 and extrusion detection lines 310 and 314 comprise a metal conductor such as copper and are substantially parallel to each other. Contact metal pad 320 is electrically connected to a first end of core metal line 312. Similarly, contact metal pad 322 is electrically connected to a second end of core metal line 312.

According to one embodiment, core metal line 312 and extrusion detection lines 310 and 314 have a "step" configuration, which advantageously decreases the scribe line length required to implement test structure 300, and which allows an increase in the number of semiconductor dies on a wafer. The step configuration of FIG. 3, which is also referred to as a "non-linear configuration" in the present application, includes multiple metal segments, where certain metal segments increase in length from a first end to a second end. In one embodiment, a longest segment has a length ranging between approximately 150 microns and approximately 200 microns. In one embodiment, a shortest segment has a length equal to approximately 1 micron. In one embodiment, the total length, i.e. sum of all segments, of core metal line 312 is equal to approximately 800 microns. Those of ordinary skill in the art shall recognize that the length of each segment and the number of segments of the step configuration can vary without departing from the scope of the present invention. As shown in FIG. 3, in the present embodiment, core metal line 312 and extrusion detection lines 310 and 314 have smooth turns, as opposed to right angle turns, to form the step configuration. In the present embodiment, right angle turns are avoided in order to avoid early electromigration or extrusion failures at sharp corners that would occur if right angle turns were utilized. As such, in the present embodiment, the failure mechanisms that will be tested and detected will not be tainted due to the existence of sharp corners.

According to the invention, test structure 300 of FIG. 3 can be used to perform isothermal testing, electromigration testing and extrusion monitoring in a similar manner as described above in relation to test structure 100 of FIG. 1. Moreover, test structure 300 of FIG. 3 can be used to determine Blech length in a similar manner as described above in relation to test structure 200 of FIG. 2.

Figure 4:
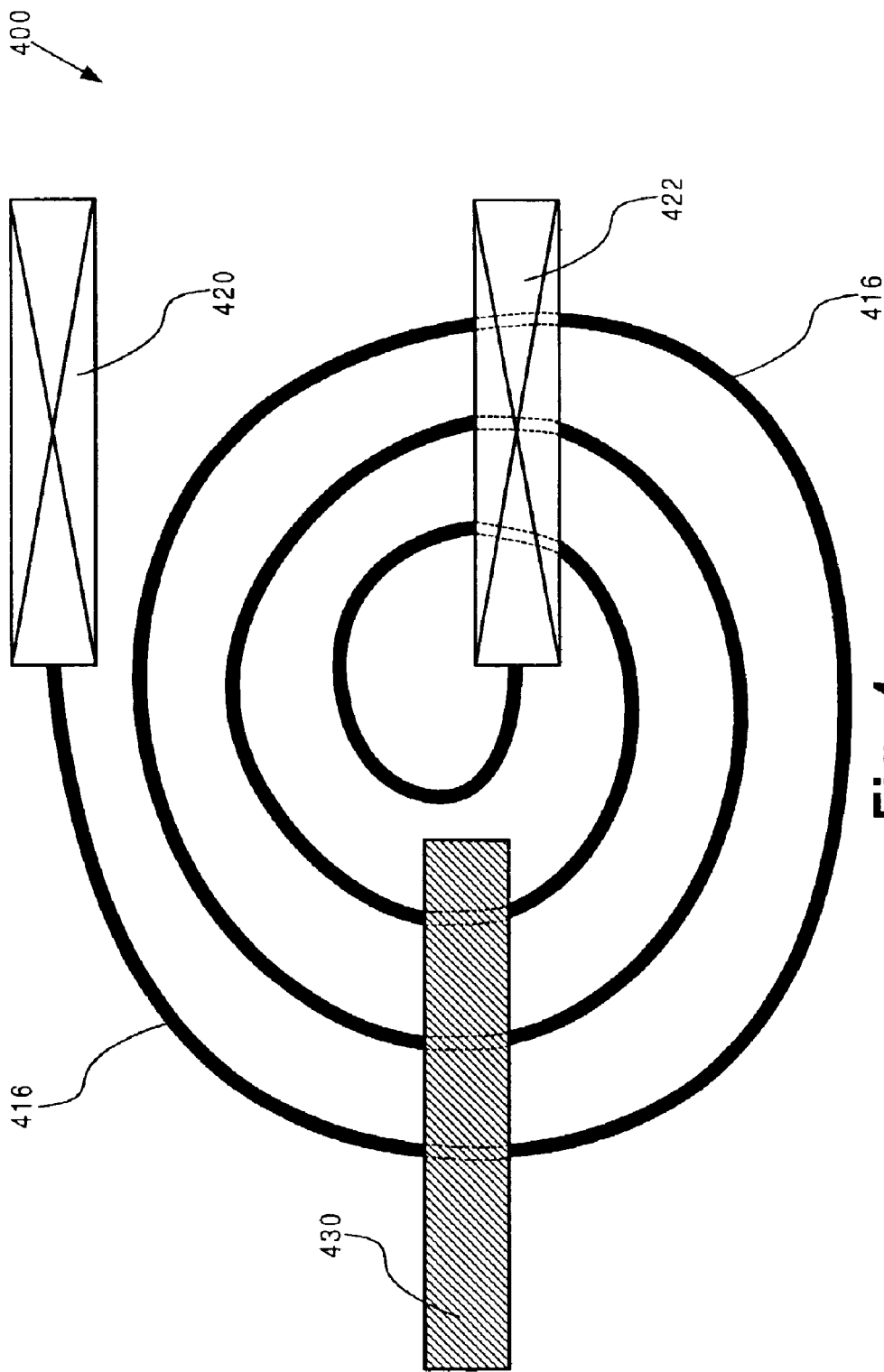
FIG. 4 shows a top view of a test structure according to one embodiment of the invention.

FIG. 4 shows a top view of test structure 400 formed in accordance with one embodiment of the invention. Test structure 400 is situated on a scribe line of a semiconductor wafer or die and includes contact metal pads 420 and 422 and extrusion monitoring segment 430, which are analogous to contact metal pads 120 and 122 and extrusion monitoring segment 130 of test structure 100 of FIG. 1, respectively. Test structure 400 further includes triple metal line 416. Triple metal line, 416 comprises a core metal line, an interior extrusion line and an exterior extrusion line (all not shown in FIG. 4), which are analogous to core metal line 112, extrusion detection lines 110 and 114 of structure 100 of FIG. 1. In one embodiment, the core metal line, the interior extrusion detection line and the exterior extrusion detection line of triple metal line 416 are substantially parallel to each other.

According to one embodiment, triple metal line 416 has a "circular spiral" configuration, which advantageously decreases the scribe line length required to implement test structure 400, and which allows an increase in the number of semiconductor dies on a wafer. The circular spiral configuration is also referred to as a "non-linear configuration" in the present application. In one embodiment, the total length of the core metal line of triple metal line 416 is equal to approximately 800 microns. Contact metal pad 420 is electrically connected to a first end of the core metal line of triple metal line 416. Similarly, contact metal pad 422 is electrically connected to a second end of the core metal line of triple metal line 416. The extrusion detection lines of triple metal line 416 are not electrically connected to metal segments 420 and 422. Contact metal pads 420 and 422 are in a higher metal level than triple metal line 416, however, contact metal segments 420 and 422 can be in different metal levels, for example, a lower metal level than triple metal line 416. Contact metal pads 420 and 422 can be used to conduct current through the core metal line of triple metal line 416.

Through appropriately placed contacts, extrusion monitoring segment 430 can aid in measuring the resistance between the core metal line of triple metal line 416 and the interior extrusion detection line of triple metal line 416 or the resistance between the core metal line of triple metal line 416 and the exterior extrusion detection line of triple metal line 416. According to one embodiment, test structure 400 of FIG. 4 can be used to perform isothermal testing, electromigration testing and extrusion monitoring in a similar manner as described above in relation to test structure 100 of FIG. 1.

From the above description of exemplary embodiments of the invention it is manifest that various techniques can be used for implementing the concepts of the present invention without departing from its scope. Moreover, while the invention has been described with specific reference to certain embodiments, a person of ordinary skill in the art would recognize that changes could be made in form and detail without departing from the spirit and the scope of the invention. For example, the segment lengths referred to in the present application can be modified without departing from the scope of the present invention. The described exemplary embodiments are to be considered in all respects as illustrative and not restrictive. It should also be understood that the invention is not limited to the particular exemplary embodiments described herein, but is capable of many rearrangements, modifications, and substitutions without departing from the scope of the invention.

Thus, space-saving test structures having improved capabilities have been described.

What is claimed is:

1. A test structure comprising:

a core metal line having a non-linear configuration, wherein said core metal line is capable of conducting current for an electromigration test, an isothermal test, and extrusion monitoring;

at least one extrusion detection line situated adjacent to said core metal line;

an extrusion monitoring segment electrically connected to said at least one extrusion detection line and adapted to determine an extrusion in said core metal line by measuring a resistance between said core metal line and said at least one extrusion detection line;

wherein said non-linear configuration does not have a right angle turn.

2. The test structure of claim 1, wherein said non-linear configuration is a serpentine configuration.

3. The test structure of claim 1, wherein said non-linear configuration is a square spiral configuration.

4. The test structure of claim 1, wherein said non-linear configuration is a step configuration.

5. The test structure of claim 1, wherein said non-linear configuration is a circular spiral configuration.

6. The test structure of claim 1, wherein said extrusion monitoring segment is utilized to indicate an extrusion when said resistance is less than a predetermined value.

7. The test structure of claim 1 further comprising:

a first contact metal pad electrically connected to a first end of said core metal line, wherein said first contact metal pad is adapted to electrically connect to a first test probe;

a second contact metal pad electrically connected to a second end of said core metal line, wherein said second contact metal pad is adapted to electrically connect to a second test probe.

8. The test structure of claim 1, wherein said core metal line has a plurality of segments adapted to determine a Blech length.

9. A test structure comprising:

a core metal line having a non-linear configuration, wherein said core metal line is capable of conducting current for an electromigration test, an isothermal test, and extrusion monitoring;

a first extrusion metal line situated adjacent to said core metal line;

a second extrusion metal line situated adjacent to said core metal line;

an extrusion monitoring segment electrically connected to said at least one extrusion detection line and adapted to determine an extrusion in said core metal line by measuring a resistance between said core metal line and said at least one extrusion detection line;

wherein said non-linear configuration does not have a right angle turn.

10. The test structure of claim 9, wherein said non-linear configuration is a serpentine configuration.

11. The test structure of claim 9, wherein said non-linear configuration is a square spiral configuration.

12. The test structure of claim 9, wherein said non-linear configuration is a step configuration.

13. The test structure of claim 9, wherein said non-linear configuration is a circular spiral configuration.

14. The test structure of claim 9 further comprising:

a first contact metal pad electrically connected to a first end of said core metal line, wherein said first contact metal pad is adapted to electrically connect to a first test probe;

a second contact metal pad electrically connected to a second end of said core metal line, wherein said second contact metal pad is adapted to electrically connect to a second test probe.

15. The test structure of claim 9, wherein said extrusion monitoring segment is utilized to indicate an extrusion when said resistance is less than a predetermined value.

16. A test structure comprising a core metal line, at least one extrusion detection line situated adjacent to said core metal line and an extrusion monitoring segment electrically connected to said at least one extrusion detection line, said test structure being characterized by:

said core metal line having a non-linear configuration, wherein said core metal line is capable of conducting current for an electromigration test, an isothermal test, and extrusion monitoring;

said extrusion monitoring segment being adapted to determine an extrusion in said core metal line by measuring a resistance between said core metal line and said at least one extrusion detection line;

wherein said non-linear configuration does not have a right angle turn.

17. The test structure of claim 16, wherein said non-linear configuration is a serpentine configuration.

18. The test structure of claim 16, wherein said non-linear configuration is a square spiral configuration.

19. The test structure of claim 16, wherein said non-linear configuration is a step configuration.

20. The test structure of claim 16, wherein said non-linear configuration is a circular spiral configuration.

* * * * *